(12) United States Patent
Laguvaram et al.

(10) Patent No.: US 11,024,590 B2
(45) Date of Patent: Jun. 1, 2021

(54) AND PLACEMENT OF DE-COUPLING CAPACITORS FOR PDN DESIGN

(71) Applicant: SEAGATE TECHNOLOGY LLC, Cupertino, CA (US)

(72) Inventors: Abhishek Nagaraj Laguvaram, Telangana (IN); Vinod Arjun Huddar, Karnataka (IN)

(73) Assignee: Seagate Technology LLC, Fremont, CA (US)

( * ) Notice: Subject to any disclaimer, the term of this patent is extended or adjusted under 35 U.S.C. 154(b) by 29 days.

(21) Appl. No.: 15/858,404

(22) Filed: Dec. 29, 2017

(65) Prior Publication Data

US 2019/0206815 A1    Jul. 4, 2019

(51) Int. Cl.
*H01L 23/66* (2006.01)
*H01L 23/498* (2006.01)
*H01L 23/50* (2006.01)
*H01L 23/64* (2006.01)
*H01L 25/16* (2006.01)
*H01L 23/00* (2006.01)

(52) U.S. Cl.
CPC ........ *H01L 23/66* (2013.01); *H01L 23/49816* (2013.01); *H01L 23/49838* (2013.01); *H01L 23/50* (2013.01); *H01L 23/642* (2013.01); *H01L 24/13* (2013.01); *H01L 25/16* (2013.01); *H01L 2223/6666* (2013.01); *H01L 2224/14131* (2013.01); *H01L 2224/16227* (2013.01); *H01L 2924/1205* (2013.01); *H01L 2924/13091* (2013.01); *H01L 2924/15311* (2013.01); *H01L 2924/381* (2013.01)

(58) Field of Classification Search
CPC . H01L 23/49816; H01L 23/642; H01L 23/66; H01L 2223/6666; H01L 24/12; H01L 24/14; H01L 2224/14131; H05K 2201/10734; H05K 2201/10015; H05K 1/0231; H05K 3/3436
See application file for complete search history.

(56) References Cited

U.S. PATENT DOCUMENTS 5,798,567 A    8/1998  Kelly et al.
7,378,733 B1 *  5/2008  Hoang .................... H01L 23/50
                                                    257/724

(Continued)

OTHER PUBLICATIONS

Wikipedia contributors. "Ceramic capacitor." Wikipedia, The Free Encyclopedia. Wikipedia, The Free Encyclopedia. Archived from Sep. 26, 2016.*

(Continued)

*Primary Examiner* — Robert G Bachner
*Assistant Examiner* — Molly K Reida
(74) *Attorney, Agent, or Firm* — Kagan Binder, PLLC

(57) ABSTRACT

Systems and methods for placing capacitors between IC bumps and BGA balls are described. In one embodiment, the method may include placing a ball grid array (BGA) package or integrated circuit (IC) package on a printed circuit board (PCB) of an electronic device, and placing a capacitor between a first BGA ball and a second BGA ball of the BGA package and/or placing a capacitor between a first IC bump and a second IC bump of the IC package to maintain impedance of a power delivery network (PDN) of the BGA package or IC package below a target impedance.

20 Claims, 5 Drawing Sheets

(56) References Cited

U.S. PATENT DOCUMENTS

| | | | |
|---|---|---|---|
| 7,387,733 B2* | 6/2008 | Baskis | C02F 3/006 210/605 |
| 2003/0165051 A1 | 9/2003 | Kledzik et al. | |
| 2004/0251529 A1 | 12/2004 | Lee et al. | |
| 2006/0024905 A1* | 2/2006 | He | H01L 28/86 438/396 |
| 2009/0194864 A1* | 8/2009 | Dang | H01L 23/3736 257/691 |
| 2013/0062762 A1* | 3/2013 | Chan | H01L 23/49816 257/738 |

OTHER PUBLICATIONS

Metal Oxide Semiconductor (MOS) Capacitors—MS Series, www.avx.com. Archived May 16, 2017.*

Wikipedia contributors. "International Technology Roadmap for Semiconductors." Wikipedia, The Free Encyclopedia. Wikipedia, The Free Encyclopedia. Archived from Nov. 20, 2016.*

Thin Film Binary MOS Capacitors, May 2, 2013, www.vishay.com/docs/61041/cba.pdf. (Year: 2013).*

RF Thin-Film Capacitors—Ultra Miniature 01005 Size Accu-P. www.avx.com. Archived Aug. 25, 2017.*

Panasonic, High-Q Capacitors (Microwave Chip Capacitors), Sep. 2008, https://media.digikey.com/pdf/Data%20Sheets/Panasonic%20Capacitors%20PDFs/ECD-G_(Hi-Q).pdf (Year: 2008).*

* cited by examiner

AND PLACEMENT OF DE-COUPLING CAPACITORS FOR PDN DESIGN

SUMMARY

The present disclosure is directed to methods and systems for placing capacitors between integrated circuit (IC) bumps and ball grid array (BGA) balls. In some embodiments, the present systems and methods may place de-coupling capacitors between IC bumps and BGA balls based on power delivery network (PDN) analysis performed for IC bumps and BGA balls in addition to or instead of performing PDN analysis for IC package decoupling and/or for printed circuit board (PCB) decoupling.

A method for placing capacitors between IC bumps and BGA balls is described. In one embodiment, the method may include placing a ball grid array (BGA) package or integrated circuit (IC) package on a printed circuit board (PCB) of an electronic device, and placing a capacitor between a first BGA ball and a second BGA ball of the BGA package and/or placing a capacitor between a first IC bump and a second IC bump of the IC package.

In some embodiments, a ball-to-ball pitch size of the BGA package or a bump-to-bump pitch size of the IC package may range from 0.5 mm to 1.0 mm. In some examples, a dimension of the capacitor may be less than the bump-to-bump or ball-to-ball pitch size. In some cases, the method may include connecting a first contact of the capacitor to the first BGA ball or the first IC bump, and connecting a second contact of the capacitor to a second BGA ball of the BGA package or the second IC bump.

In some embodiments, the first contact or the second contact may include a metallic electrode plate, a metal pin, a metal pad, a metal lead, or a wire bonded lead. In some examples, the first BGA ball or the first IC bump may be associated with a positive supply voltage, and the second BGA ball or the second IC bump may be associated with ground or a negative supply voltage.

In some embodiments, the placement of the capacitor may increase an efficiency of power distribution on a die of the BGA package or the IC package and improve a reliability of a power delivery network (PDN) of the BGA package or the IC package. In some cases, the method may include bypassing placement of a decoupling capacitor on the PCB to decrease loop inductance and to reduce a cost associated with a die, package, printed circuit board, and/or electronic device. In some examples, the method may include bypassing placement of a decoupling capacitor inside the BGA package or inside the IC package to decrease loop inductance and reduce a cost associated with a die, package, printed circuit board, and/or electronic device.

In some embodiments, the capacitor may include a metal oxide semiconductor (MOS) capacitor or a MOS field effect transistor (MOSFET) capacitor. In some cases, the capacitor may be manufactured with a process node between 30 nanometer (nm) and 20 nm. In some examples, the capacitor may provide a capacitance between 1 femtofarads and 100 nanofarads.

An apparatus for placing capacitors between IC bumps and BGA balls is also described. In one embodiment, the apparatus may include a PCB, a BGA package or IC package attached to the PCB, and a capacitor placed between BGA balls of the BGA package and/or between IC bumps of the IC package.

A storage system for placing capacitors between IC bumps of an IC package of the storage system and placing capacitors between BGA balls of a BGA package of the storage system is also described. In one embodiment, the storage system device may include a storage drive, a PCB of the storage drive, a BGA package or IC package attached to the PCB, and a capacitor placed between BGA balls of the BGA package or between IC bumps of the IC package to maintain impedance of a power delivery network (PDN) of the BGA package or IC package below a target impedance even when the BGA package or IC package is operating with relatively high signal frequencies.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

Figure 1:
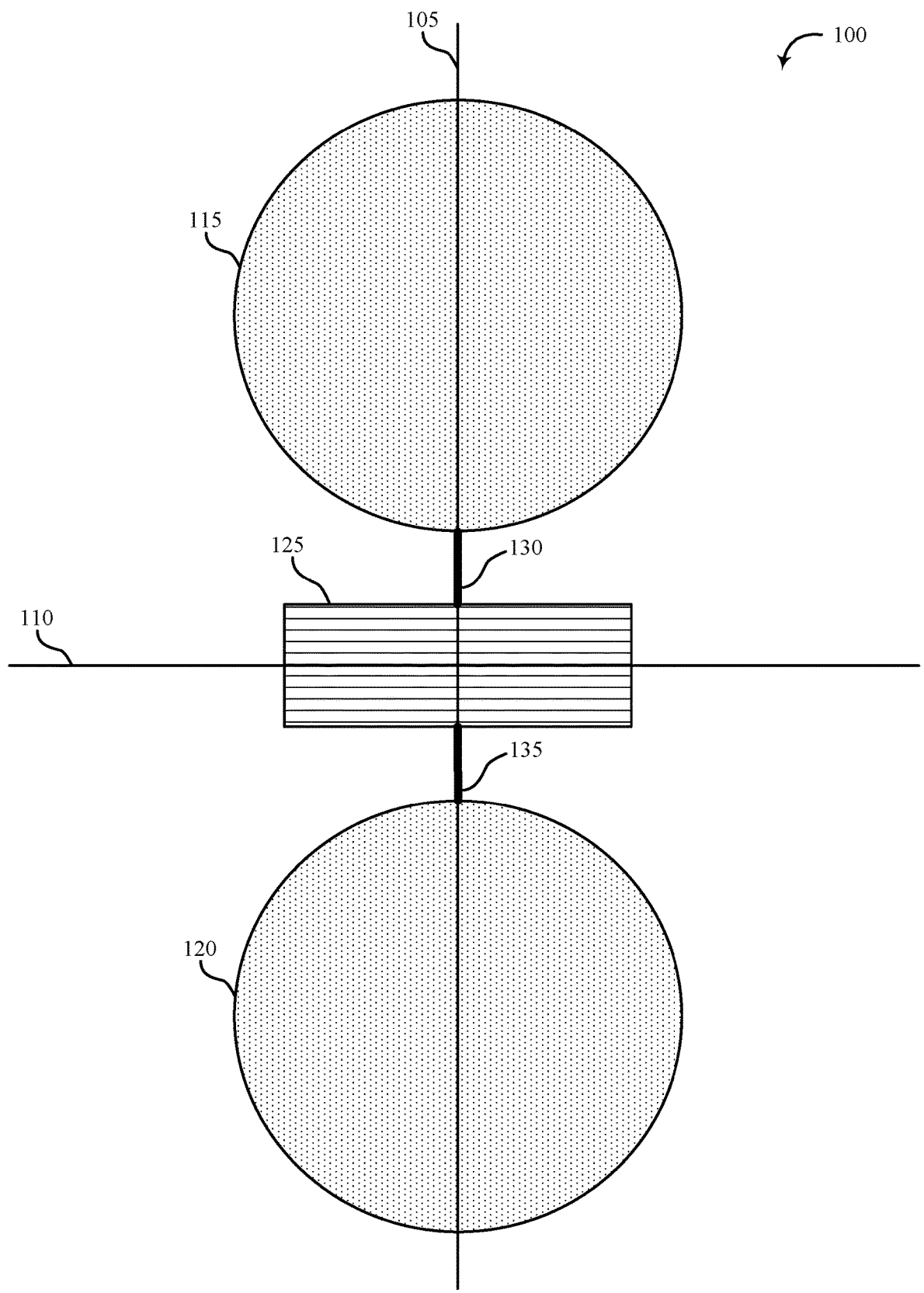
FIG. 1 shows one embodiment of an environment in accordance with various aspects of this disclosure.

The following relates generally to placing capacitors between IC bumps and BGA balls. Currently, no capacitor form factor is available today that can be placed in between ball grid array (BGA) balls or in between integrated circuit (IC) bumps to function as a decoupling capacitor (decap). In some cases, the present systems and methods may include placing a capacitor on a substrate of a BGA package between the BGA balls and/or on a substrate of an IC package between IC bumps. The 1005 capacitor is one of the smallest form factors available on the market today, but the 1005 capacitor cannot be used in between IC bumps or BGA balls. Currently, there is no de-coupling power delivery network (PDN) analysis that is performed for IC bumps or BGA balls. Currently, PDN analysis is performed for on-die decoupling, IC package decoupling, and/or printed circuit board (PCB) decoupling.

In some cases, PDN design may be limited to using the 0402 and/or 0201 capacitors available on the market, but the present systems and methods include capacitors that may be used in between BGA balls and IC bumps to minimize the simultaneous switching noise (SSN) and provide a reliable power supply to the circuit. When multiple output drivers of a chip switch simultaneously, they induce a voltage drop in the chip/package power distribution. The simultaneous switching momentarily raises the ground voltage within the chip/package relative to the system ground. This apparent shift in the ground potential to a non-zero value may be referred to as simultaneous switching noise (SSN) or ground bounce.

The capacitor of the present systems and methods may include a transistor-based capacitor. As one example, the capacitor of the present systems and methods may include a metal oxide semiconductor (MOS) capacitor. In some cases, the capacitor of the present systems and methods may include a MOS field-effect transistor (MOSFET) capacitor. In some embodiments, the capacitor of the present systems and methods may include a silicon wafer or another type of semiconductor wafer. In some cases, the capacitor of the present systems and methods may include a manufacturing process of creating capacitors in various capacitance values and/or with various dimensions to cater to varying bump pitch and ball pitch sizes. In some embodiments, the capacitor of the present systems and methods may include capacitor standard cells manufactured within a range of node sizes such as 28 nanometer (nm), 22 nm, 20 nm, 16 nm, 14 nm, or 10 nm. The technology node (also known as process node, process technology, or node) refers to a specific semiconductor manufacturing process and associated design rules. In some embodiments, the capacitor of the present systems and methods may include a capacitor configured to provide any capacitance between 1 femtofarads (fF) and 100 nanofarads (nF). In some cases, the capacitor of the present systems and methods may include an application specific integrated circuit (ASIC). In some embodiments, the capacitor of the present systems and methods may include a two-contact IC or a two-contact ASIC. As one example, the capacitor of the present systems and methods may include a 2-pin ASIC created using standard cells. In some cases, the 2-pin ASIC capacitor may be configured with dimensions less than a bump-to-bump or ball-to-ball pitch size. Thus, the 2-pin ASIC capacitor may be inserted between IC bumps or BGA balls and provide the decoupling that is typically done at the package or PCB level. Placing decaps between IC bumps or BGA balls makes the PDN network more robust and lessens the capacitors used in package. Currently, package decoupling capacitor accommodation is a relatively expensive process. Accordingly, placing the capacitor of the present systems and methods between IC bumps and BGA balls results in a significant reduction or complete elimination of decaps being placed on package and/or PCB, resulting in significant savings in manufacturing costs.

The capacitors of the present systems and methods can be designed in sizes smaller than any capacitor currently available for the applications disclosed herein. Thus, the capacitors of the present systems and methods are able to be placed in between BGA balls and/or IC bumps. Also, the capacitance values of the capacitors of the present systems and methods may be designed based at least in part on the number of capacitors placed in series and/or placed in parallel. As one example, two 1 fF capacitors of the present systems and methods may be placed in series in between BGA balls and/or IC bumps to provide a capacitance of 0.5 fF. In one example, two 1 fF capacitors of the present systems and methods may be placed in parallel in between BGA balls and/or IC bumps to provide a capacitance of 2 fF.

In one embodiment, capacitors of the present systems and methods can be designed and configured with capacitance values that are not industry standard capacitance values or with capacitance values not easily obtained. For example, a conventional capacitor may be provided with a capacitance of 1 nF, but no conventional capacitor is designed with a capacitance of 1.285 nF, as one example. Thus, when PDN design calls specifically for a 1.285 nF capacitor, the capacitor of the present systems and methods may be designed to have a capacitance of 1.285 nF, which is not possible using traditional capacitor design techniques.

Benefits of placing capacitors between BGA balls and IC bumps include suppressing high frequency ripple and maintaining the impedance of PDN below a predetermined target impedance when operations of the BGA package or IC package include relatively high signal frequencies. The capacitor of the present systems and methods provide capacitance for frequency ranges beyond the gigahertz (GHz) range, which is not possible in any capacitor currently available. The capacitor of the present systems and methods may be utilized for input/output (I/O) power and/or core power on IC bumps and BGA balls to maintain a healthy PDN for the associated system. An additional benefit of placing capacitors between BGA balls and IC bumps includes a reduction in loop inductance as compared to package decaps and/or board decaps. Thus, placing capacitors between BGA balls and IC bumps provides a design advantage to supply transient currents more efficiently at a lower cost than traditional capacitor placement at the package and/or PCB.

FIG. 1 shows one embodiment of an environment 100 in which the present systems and methods may be implemented. At least one aspect of environment 100 may be implemented in conjunction with one or more processors of a computing device and/or one or more processors executing code in conjunction with a PCB fabrication machine.

As depicted, environment 100 includes a vertical mirror line 105 and a horizontal mirror line 110. It is noted that vertical mirror line 105 and horizontal mirror line 110 are not physical features on a printed circuit board, but rather these mirror lines are provided to illustrate features of the present systems and methods including certain symmetrical features.

As illustrated, environment 100 includes a first BGA ball 115, a second BGA ball 120, a capacitor 125, a first connection 130, and a second connection 135. Although environment 100 depicts placing capacitor 125 between BGA balls, it is understood that details of the placing of capacitor 125 in environment 100 also applies to placing capacitor 125 between IC bumps.

In one embodiment, capacitor 125 may be placed in between first BGA ball 115 and second BGA ball 120. In some examples, first BGA ball 115 and second BGA ball 120 may be part of a set of BGA balls placed on a substrate of a BGA package. In some cases, the present systems and methods may include placing capacitor 125 on the substrate of the BGA package of first BGA ball 115 and second BGA ball 120.

As depicted, capacitor 125 may connect to first BGA ball 115 via first connection 130. Similarly, capacitor 125 may connect to second BGA ball 120 via second connection 135.

In some embodiments, first connection 130 or second connection 135, or both, may include a metallic electrode plate, a metal pin, a metal pad, a metal lead, or a wire bonded lead. As illustrated, capacitor 125 may be rectangular where a length of capacitor 125 is greater than a width of capacitor 125. Alternatively, capacitor may be configured with another shape such as a square shape, an oval shape, a polygon shape, etc. As shown, capacitor 125 may be placed so that the edges of the shorter width of capacitor 125 respectively face the first BGA ball 115 and second BGA ball 120. Alternatively, capacitor 125 may be placed so that the edges of the length of capacitor 125 face first BGA ball 115 and second BGA ball 120. As shown, capacitor 125 may be centered between first BGA ball 115 and second BGA ball 120 relative to vertical mirror line 105 and/or relative to horizontal mirror line 110. In some cases, capacitor 125 may be placed off-center relative to vertical mirror line 105 and/or relative to horizontal mirror line 110.

In one embodiment, an apparatus of the present systems and methods may be configured for placing capacitors between IC bumps and BGA balls. In some embodiments, the apparatus may include one or more processors, memory, and/or one or more storage devices. In some examples, software and/or firmware (for example, stored in the memory and/or a storage device of the apparatus) may be executed on the apparatus. Such software and/or firmware executed on the one or more processors may be operable to cause the apparatus to place capacitors between IC bumps of an IC package and/or to place capacitors between BGA balls of a BGA package.

One or more of the components of the apparatus, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other Semi-Custom ICs, which may be programmed in any manner known in the art. The functions of each module may also be implemented, in whole or in part, with instructions embodied in memory formatted to be executed by one or more general and/or application-specific processors.

The memory of the apparatus may include random access memory (RAM), read only memory (ROM), flash memory, and/or other types. The memory 410 may store computer-readable, computer-executable software/firmware code including instructions that, when executed by the one or more processors of the apparatus, cause the apparatus to perform various functions described in this disclosure. Alternatively, the computer-readable, computer-executable software/firmware code may not be directly executable by a processor of the apparatus, but may be configured to cause a computer, when compiled and executed, to perform functions described herein. The one or more processors of the apparatus may include an intelligent hardware device, for example, a central processing unit (CPU), a microcontroller, an application-specific integrated circuit (ASIC), field programmable gate array (FPGA), or any combination thereof.

Figure 2:
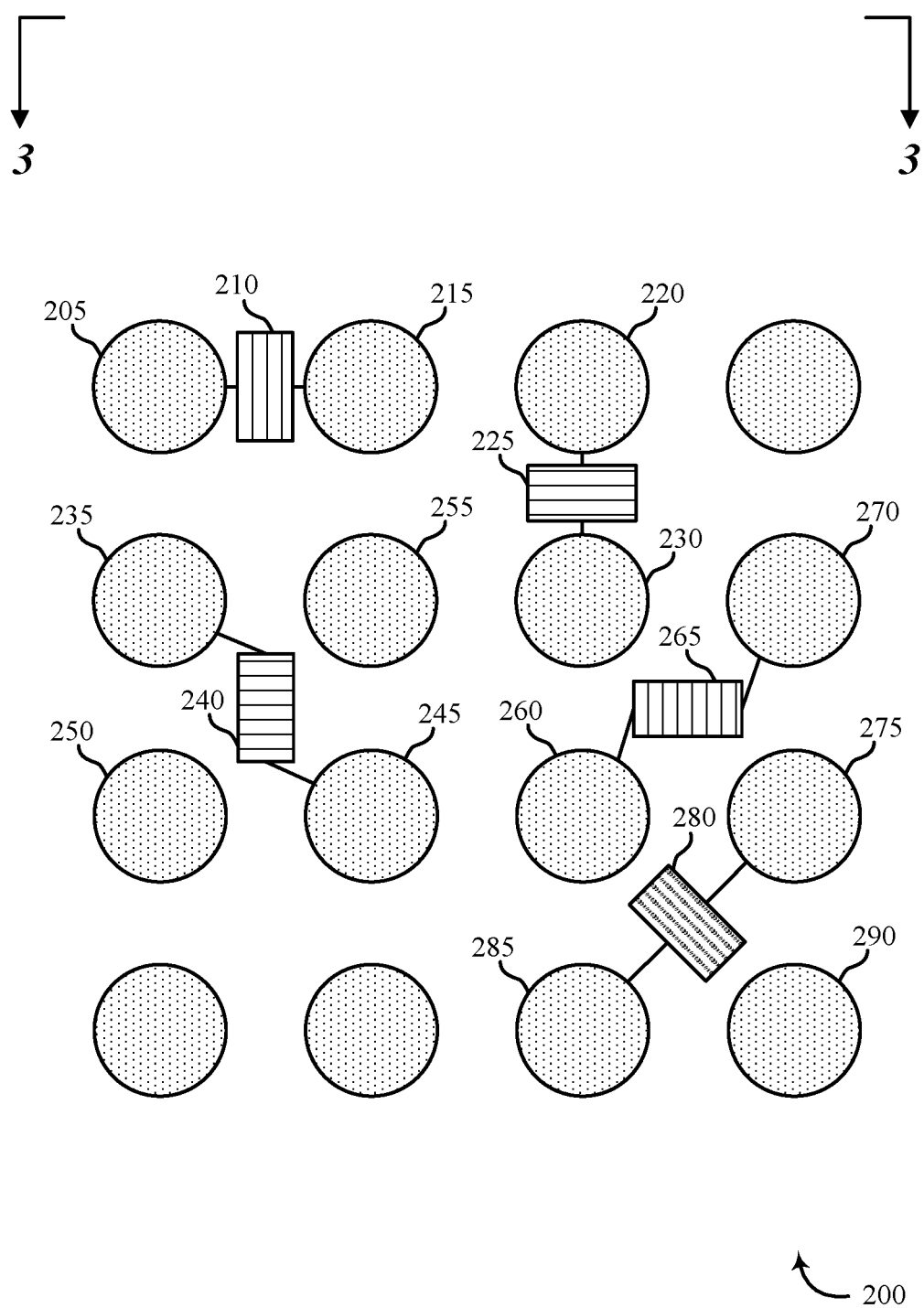
FIG. 2 shows one embodiment of an environment in accordance with various aspects of this disclosure.

FIG. 2 shows one embodiment of an environment 200 in which the present systems and methods may be implemented. At least one aspect of environment 200 may be implemented in conjunction with one or more processors of a computing device and/or one or more processors executing code in conjunction with a PCB fabrication machine. Environment 200 depicts the placement of capacitors between BGA balls laid out in a grid. Although environment 200 depicts placing capacitors between BGA balls, it is understood that details of the placing of the capacitors in environment 200 also applies to placing capacitors between IC bumps.

In one embodiment, capacitor 210 may be placed centered between BGA bump 205 and BGA bump 215. As depicted, capacitor 210 may be placed vertically relative to the depicted point of view of environment 200. As shown, capacitor 210 may connect electrically to BGA bump 205 and BGA bump 215.

In one embodiment, capacitor 225 may be placed centered between BGA bump 220 and BGA bump 230. As depicted, capacitor 225 may be placed horizontally relative to the depicted point of view of environment 200. As shown, capacitor 225 may connect electrically to BGA bump 220 and BGA bump 230.

In one embodiment, capacitor 240 may be placed centered between BGA bumps 235, 245, 250, and 255 as shown. As depicted, capacitor 240 may be placed vertically relative to the depicted point of view of environment 200. As shown, capacitor 240 may connect electrically to BGA bump 235 and BGA bump 245.

In one embodiment, capacitor 265 may be placed centered between BGA bumps 230, 260, 270, and 275 as shown. As depicted, capacitor 265 may be placed horizontally relative to the depicted point of view of environment 200. As shown, capacitor 265 may connect electrically to BGA bump 270 and BGA bump 260.

In one embodiment, capacitor 280 may be placed centered between BGA bumps 260, 275, 285, and 290 as shown. As depicted, capacitor 280 may be placed diagonally relative to the depicted point of view of environment 200. As shown, capacitor 280 may connect electrically to BGA bump 275 and BGA bump 285.

Figure 3:
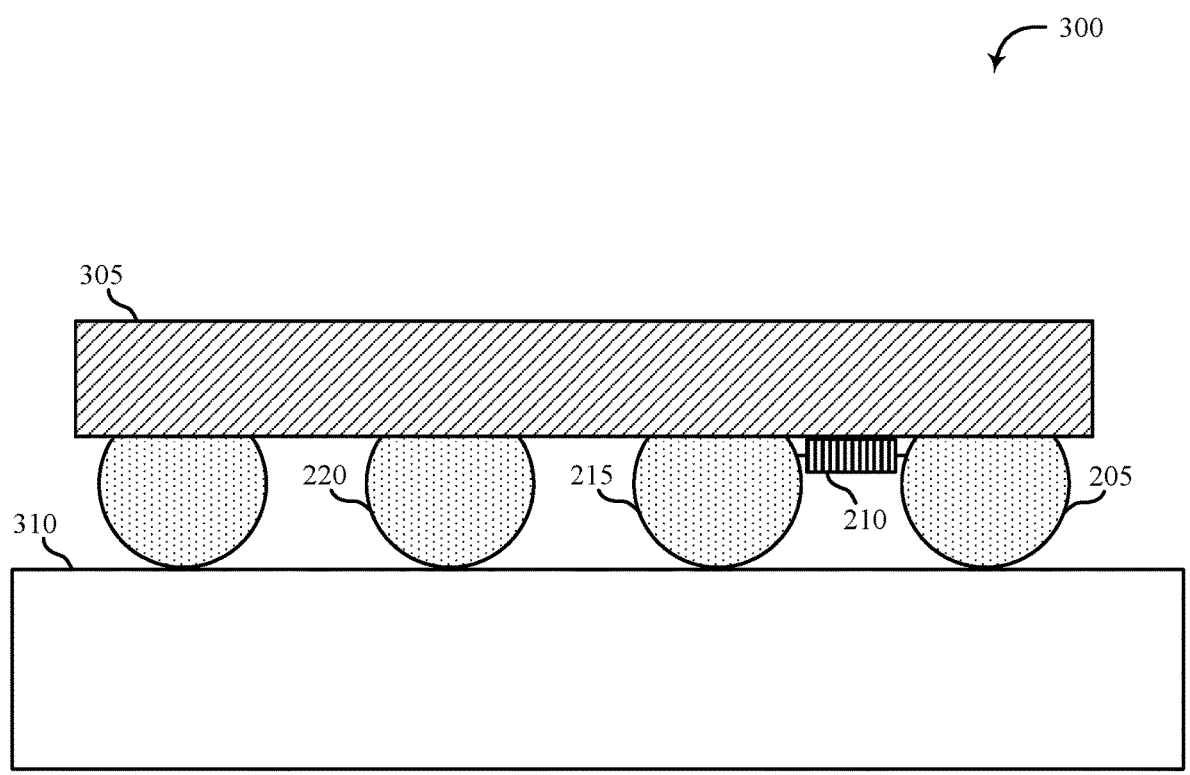
FIG. 3 shows one embodiment of an environment in accordance with various aspects of this disclosure.

FIG. 3 shows one embodiment of an environment 300 in which the present systems and methods may be implemented. At least one aspect of environment 300 may be implemented in conjunction with one or more processors of a computing device and/or one or more processors executing code in conjunction with a PCB fabrication machine. Environment 300 depicts the placement of capacitors between BGA balls. Although environment 300 depicts placing capacitors between BGA balls, it is understood that details of the placing of the capacitors in environment 300 also applies to placing capacitors between IC bumps.

As shown, environment 300 includes a BGA package 305 placed on a printed circuit board (PCB) 310. As depicted, BGA package 305 connects to PCB 310 through multiple BGA balls. The BGA balls include BGA balls 205, 210, and 215, among others. As shown, environment 300 includes capacitor 210 placed between BGA ball 205 and BGA ball 215. In one embodiment, capacitor 210 connects electrically to BGA ball 205 and BGA ball 215. In some cases, capacitor 210 is mounted to a surface or substrate of BGA package 305. In some examples, capacitor 210 is mounted to the same side of the surface or substrate of BGA package 305 to which BGA balls 205, 215, and 220 are placed.

Figure 4:
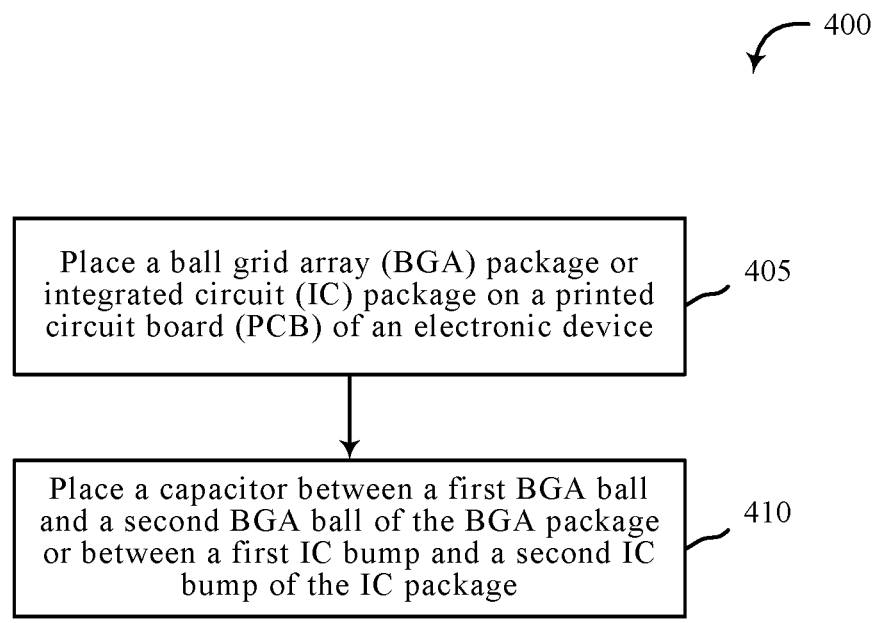
FIG. 4 is a flow chart illustrating an example of a method in accordance with various aspects of this disclosure.

FIG. 4 is a flow chart illustrating an example of a method 400 for placing capacitors between IC bumps and BGA balls, in accordance with various aspects of the present disclosure. One or more aspects of the method 400 may be implemented in conjunction with one or more processors, memory, and/or storage drives of one or more devices. The one or more devices may include an apparatus configured for placing capacitors, a computing device, and/or a PCB fabrication machine. In some examples, the apparatus, computing device, and/or PCB fabrication machine may execute one or more sets of codes to control the functional elements of the apparatus, computing device, and/or PCB fabrication machine to perform one or more of the functions described below. Additionally or alternatively, the apparatus, computing device, and/or PCB fabrication machine may perform one or more of the functions described below using special-purpose hardware.

At block 405, the method 400 may include placing a ball grid array (BGA) package or integrated circuit (IC) package on a printed circuit board (PCB) of an electronic device. At block 410, the method may include placing a capacitor between a first BGA ball and a second BGA ball of the BGA package or between a first IC bump and a second IC bump of the IC package.

The operation(s) at block 405 and 410 may be performed using an apparatus configured for placing capacitors, a computing device, and/or a PCB fabrication machine with reference to the operations described and depicted in relation to FIGS. 1-3. Thus, the method 400 may provide for placing capacitors between IC bumps and BGA balls as described herein. It should be noted that the method 400 is just one implementation and that the operations of the method 400 may be rearranged, omitted, and/or otherwise modified such that other implementations are possible and contemplated.

Figure 5:
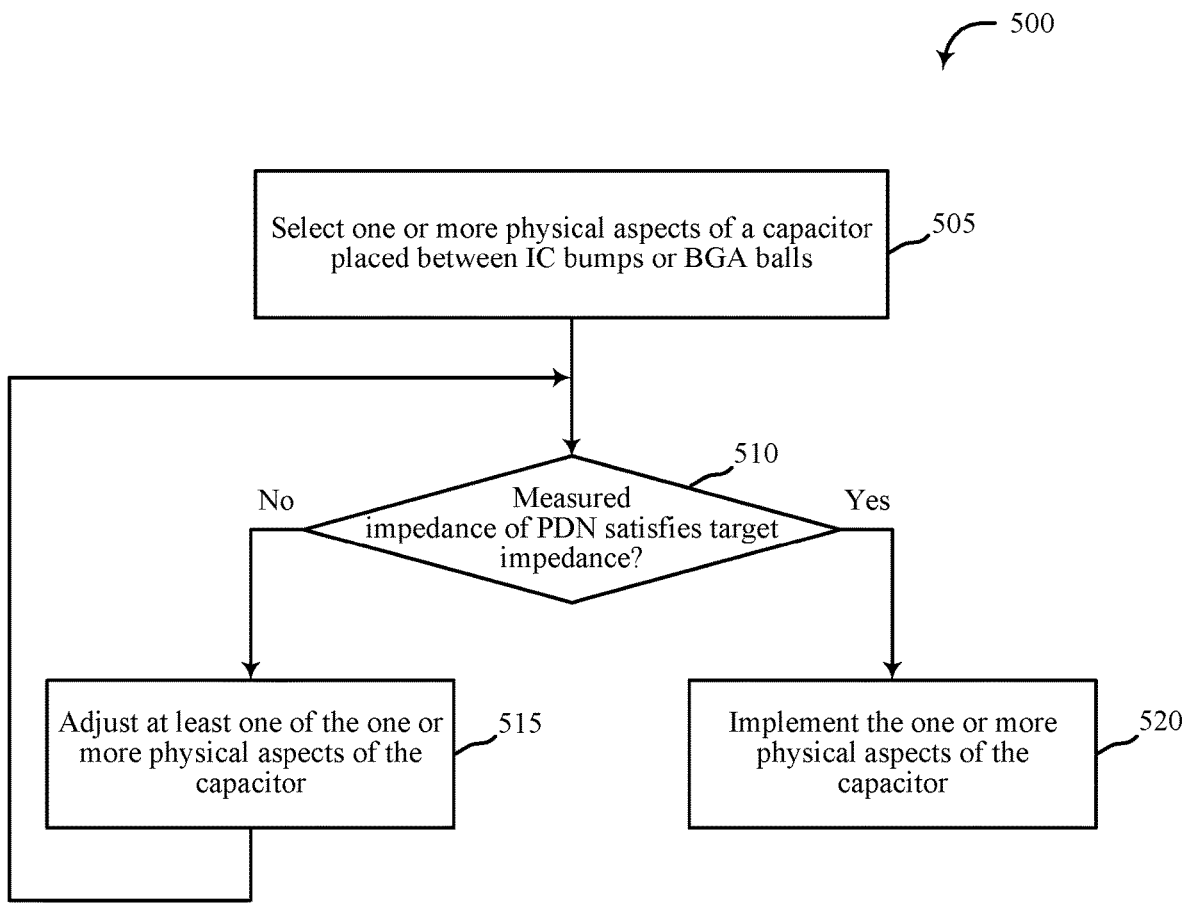
FIG. 5 is a flow chart illustrating an example of a method in accordance with various aspects of this disclosure.

FIG. 5 is a flow chart illustrating an example of a method 500 for placing capacitors between IC bumps and BGA balls, in accordance with various aspects of the present disclosure. One or more aspects of the method 500 may be implemented in conjunction with one or more processors, memory, and/or storage drives of one or more devices. The one or more devices may include an apparatus configured for placing capacitors, a computing device, and/or a PCB fabrication machine. In some examples, the apparatus, computing device, and/or PCB fabrication machine may execute one or more sets of codes to control the functional elements of the apparatus, computing device, and/or PCB fabrication machine to perform one or more of the functions described below. Additionally or alternatively, the apparatus, computing device, and/or PCB fabrication machine may perform one or more of the functions described below using special-purpose hardware.

At block 505, the method 500 may include selecting one or more physical aspects of a capacitor placed or to be placed between IC bumps of an IC package or between BGA balls of a BGA package. At block 510, the method 500 may include determining whether a measured impedance of a power delivery network (PDN) of the BGA package or IC package satisfies a target impedance. At block 515, upon determining the measured impedance is not within the predetermined range of the target impedance, the method 500 may include adjusting at least one of the one or more physical aspects of the capacitor. At block 520, upon determining the measured impedance is within the predetermined range, the method 500 may include implementing the one or more physical aspects of the capacitor.

The operation(s) at block 505-520 may be performed using an apparatus configured for placing capacitors, a computing device, and/or a PCB fabrication machine with reference to the operations described and depicted in relation to FIGS. 1-3. Thus, the method 500 may provide for placing capacitors between IC bumps and BGA balls as described herein. It should be noted that the method 500 is just one implementation and that the operations of the method 500 may be rearranged, omitted, and/or otherwise modified such that other implementations are possible and contemplated.

In some examples, aspects from two or more of the methods 400 and 500 may be combined and/or separated. It should be noted that the methods 400 and 500 are just example implementations, and that the operations of the methods 400 and 500 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A method comprising:
placing a ball grid array (BGA) package or integrated circuit (IC) package on a printed circuit board (PCB) of an electronic device; and
placing a first decoupling capacitor between a first BGA ball and a second BGA ball of the BGA package or between a first IC bump and a second IC bump of the IC package and electrically connecting the first decoupling capacitor between the first BGA ball and the second BGA ball of the BGA package or between the first IC bump and the second IC bump of the IC package, wherein the first decoupling capacitor comprises a two-contact IC that includes a semiconductor layer and provides a capacitance within a range of 1 femtofarad and less than 100 femtofarads and operates in a range of greater than a gigahertz (GHz) range.

2. The method of claim 1, wherein:
a ball-to-ball pitch size of the BGA package or a bump-to-bump pitch size of the IC package ranges from 0.5 mm to 1.0 mm, a dimension of the first decoupling capacitor being less than the bump-to-bump or ball-to-ball pitch size.

3. The method of claim 1, further comprising:
connecting a first contact of the first decoupling capacitor to the first BGA ball or the first IC bump; and
connecting a second contact of the first decoupling capacitor to a second BGA ball of the BGA package or the second IC bump.

4. The method of claim 3, wherein:
the first contact or the second contact includes a metallic electrode plate, a metal pin, a metal pad, a metal lead, or a wire bonded lead.

5. The method of claim 3, wherein:
the first BGA ball or the first IC bump is associated with a positive supply voltage; and
the second BGA ball or the second IC bump is associated with ground or a negative supply voltage.

6. The method of claim 1, wherein:
the placement of the first decoupling capacitor increasing an efficiency of power distribution on a die of the BGA package or the IC package and improving a reliability of a power delivery network (PDN) of the BGA package or the IC package.

7. The method of claim 1, further comprising:
bypassing placement of at least one decoupling capacitor on the PCB to decrease loop inductance and to reduce a cost of the electronic device.

8. The method of claim 1, wherein:
bypassing placement of at least one decoupling capacitor inside the BGA package or inside the IC package to decrease loop inductance and to reduce a cost of the electronic device.

9. The method of claim 1, further comprising:
placing a second decoupling capacitor between a third BGA ball and a fourth BGA ball of the BGA package or between a third IC bump and a fourth IC bump of the IC package, the second decoupling capacitor including a metal oxide semiconductor (MOS) capacitor or a MOS field effect transistor (MOSFET) capacitor, the second capacitor being manufactured with a process node between 30 nanometer (nm) and 20 nm.

10. An apparatus comprising:
a printed circuit board (PCB);
a ball grid array (BGA) package or integrated circuit (IC) package attached to the PCB; and a first decoupling capacitor placed between BGA balls of the BGA package or between IC bumps of the IC package electrically connecting the first BGA ball and the second BGA ball of the BGA package or the first IC bump and the second IC bump of the IC package, wherein the first decoupling capacitor comprises a two-contact IC that includes a semiconductor layer and provides a capacitance within a range of 1 femtofarad and less than 100 femtofarads and operates in a range of greater than a gigahertz (GHz) range.

11. The apparatus of claim 10, wherein:
a ball-to-ball pitch size of the BGA package or a bump-to-bump pitch size of the IC package ranges from 0.5 mm to 1.0 mm, a dimension of the first decoupling capacitor being less than the bump-to-bump or ball-to-ball pitch size.

12. The apparatus of claim 10, comprising:
a first contact of the first decoupling capacitor to connect the first decoupling capacitor to the first BGA ball or the first IC bump; and
a second contact of the first decoupling capacitor to connect the first decoupling capacitor to a second BGA ball of the BGA package or the second IC bump.

13. The apparatus of claim 12, wherein:
the first contact or the second contact includes a metallic electrode plate, a metal pin, a metal pad, a metal lead, or a wire bonded lead.

14. The apparatus of claim 12, wherein:
the first BGA ball or the first IC bump is associated with a positive supply voltage; and
the second BGA ball or the second IC bump is associated with ground or a negative supply voltage.

15. The apparatus of claim 10, wherein:
the placement of the first decoupling capacitor increasing an efficiency of power distribution on a die of the BGA package or the IC package and improving a reliability of a power delivery network (PDN) of the BGA package or the IC package.

16. The apparatus of claim 10, wherein
placement of at least one decoupling capacitor on the PCB is bypassed to decrease loop inductance and to reduce a cost of the apparatus.

17. The apparatus of claim 10, wherein:
placement of at least one decoupling capacitor inside the BGA package or inside the IC package is bypassed to decrease loop inductance and to reduce a cost of the apparatus.

18. The apparatus of claim 10, wherein the first decoupling capacitor comprises a two-contact application specific integrated circuit (ASIC).

19. A storage system comprising:
a storage drive;
a printed circuit board (PCB) of the storage drive;
a ball grid array (BGA) package or integrated circuit (IC) package attached to the PCB; and
a first capacitor placed between BGA balls of the BGA package or between IC bumps of the IC package electrically connecting the first BGA ball and the second BGA ball of the BGA package or the first IC bump and the second IC bump of the IC package to maintain impedance of a power delivery network (PDN) of the BGA package or IC package below a target impedance, wherein the first capacitor comprises a two-contact IC that includes a semiconductor layer and provides a capacitance within a range of 1 femtofarad and less than 100 femtofarads and operates in a range of greater than a gigahertz (GHz) range.

20. The storage system of claim 19, wherein:
a ball-to-ball pitch size of the BGA package or a bump-to-bump pitch size of the IC package ranges from 0.5 mm to 1.0 mm, a dimension of the first decoupling capacitor being less than the bump-to-bump or ball-to-ball pitch size.

* * * * *

UNITED STATES PATENT AND TRADEMARK OFFICE
CERTIFICATE OF CORRECTION

| | | |
|---|---|---|
| PATENT NO. | : 11,024,590 B2 | Page 1 of 1 |
| APPLICATION NO. | : 15/858404 | |
| DATED | : June 1, 2021 | |
| INVENTOR(S) | : Abhishek Nagaraj Laguvaram and Vinod Arjun Huddar | |

It is certified that error appears in the above-identified patent and that said Letters Patent is hereby corrected as shown below:

On the Title Page

Item (54), and in the Specification, Column 1, Lines 1-2, In the Title, please replace:
--AND PLACEMENT OF DE-COUPLING CAPACITORS FOR PDN DESIGN--
With:
--DESIGN AND PLACEMENT OF DE-COUPLING CAPACITORS FOR PDN DESIGN--

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*